(12) United States Patent
Mercaldi (10) Patent No.: US 6,473,328 B1
(45) Date of Patent: Oct. 29, 2002

(54) THREE-DIMENSIONAL MAGNETIC MEMORY ARRAY WITH A MINIMAL NUMBER OF ACCESS CONDUCTORS THEREIN

(75) Inventor: Garry Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,965

(22) Filed: Aug. 30, 2001

(51) Int. Cl.[7] .................... G11C 11/15; H01L 21/00
(52) U.S. Cl. ................ 365/130; 365/129; 365/158; 365/171; 365/173; 365/51; 365/66; 365/63; 438/3
(58) Field of Search .................. 365/130, 129, 365/158, 173, 171, 51, 63, 66; 438/3

(56) References Cited

U.S. PATENT DOCUMENTS

| | | | |
|---|---|---|---|
| 5,496,759 A | 3/1996 | Yue et al. ........................ 438/3 |
| 5,569,617 A | 10/1996 | Yeh et al. ....................... 438/3 |
| 5,756,366 A | 5/1998 | Berg et al. ...................... 438/3 |
| 5,956,267 A | 9/1999 | Hurst et al. ................... 365/158 |
| 6,048,739 A | 4/2000 | Hurst et al. ..................... 438/3 |
| 6,128,239 A | * 10/2000 | Perner ......................... 365/209 |
| 6,226,197 B1 | * 5/2001 | Nishimura .................... 365/171 |
| 6,358,757 B2 | * 3/2002 | Anthony ......................... 438/3 |

* cited by examiner

Primary Examiner—Andrew Q. Tran (57) ABSTRACT

A structure and method for forming a magnetic memory having a number N of levels of magnetic memory cells by forming a plurality of levels of magnetic memory cells, each level including at least one magnetic memory core structure having first and second surfaces, forming a first access conductor connecting to the first surface, forming a second access conductor connecting to the second surface, wherein N+1 access conductors are formed per number N of levels of magnetic memory cells. The structure comprises a plurality of levels of magnetic memory cells, each level including at least one magnetic memory having a number N of levels of magnetic memory cells, including a magnetic memory core structure having first and second surfaces, the first and second surfaces each connecting to an individual access conductor, wherein N+1 access conductors are employed per number N of levels of magnetic memory cells.

38 Claims, 7 Drawing Sheets

THREE-DIMENSIONAL MAGNETIC MEMORY ARRAY WITH A MINIMAL NUMBER OF ACCESS CONDUCTORS THEREIN

FIELD OF THE INVENTION

This invention relates to magnetic thin film semiconductor devices and, more particularly, to a thin film magnetoresistive memory device.

BACKGROUND OF THE INVENTION

Memory devices are used in electronic systems and computers to store information in the form of binary data. These memory devices may be characterized as either volatile memory, where the stored data is lost if the power source is disconnected or removed or non-volatile, where the stored data is retained even during power interruption. An example of a non-volatile memory device is the magnetic random access memory (MRAM).

An MRAM can be formed, to considerable advantage, based on the storage of digital bits as alternative states of magnetization of magnetic materials in each memory cell, typically thin-film materials. These films may be thin magnetic films having information stored therein based on the direction of the magnetization occurring in those films. The information is typically obtained either by inductive sensing to determine the magnetization state, or by magnetoresistive sensing of each state.

An arrangement for sensing states of magnetization in thin film magnetic material portions used in memory cells for storing bits is based on choosing a thin film magnetic material which also exhibits a sufficient magnetoresistance property. Changes in electrical resistance of such a material with the application, removal or change in magnitude of a magnetic field do not depend on the dimensions of the film portion. Thus the film portion to store a bit can be made very small to improve the packing density of cells in a magnetic memory.

Such magnetic thin-film memories may be conveniently provided on the surface of a monolithic integrated circuit to provide easy electrical interconnection between the memory cells and the memory operating circuitry on the monolithic integrated circuit. When so provided, it is desirable to reduce the size and increase the packing density of the magnetic thin-film memory cells to achieve a significant density of stored digital bits.

Typically, a thin-film magnetic memory includes a number of bit lines intersected by a number of word lines. At each intersection, a thin film of magnetically coercive material is interposed between the corresponding word line and bit line. The magnetic material at each intersection forms a magnetic memory cell in which a bit of information is stored.

The word lines are often provided on a first metal interconnect layer and the bit lines are provided on another. In each case, the metal interconnect layers must typically be connected to supporting circuitry or other underlayer structures on the monolithic integrated circuit for the memory to function. In addition, portions of the first metal interconnect layer are often connected to portions of the second metal interconnect layer to complete selected circuit elements.

The number of metal interconnect layers, typically copper interconnect layers, in the proceeding arrangement requires two metal interconnects for each plane (or level) of magnetic memory cells. As density becomes an issue, the amount of substrate space required must be taken into account. The structural arrangement of a magnetoresistive memory device is a significant focus of the present invention.

SUMMARY OF THE INVENTION

Exemplary embodiments of the present invention include a structure and method for forming a magnetic memory having a number N of levels of magnetic memory cells by forming at least one magnetic memory core structure having first and second surfaces, forming a first access conductor connecting to the first surface, forming a second access conductor connecting to the second surface, wherein N+1 access conductors are employed per number N of levels of the magnetic memory cells. The structure comprises a magnetic memory having a number N of levels of magnetic memory cells, each including at least one magnetic memory core structure having first and second surfaces, the first and second surfaces each connecting to an individual access conductor, wherein N+1 access conductors are required per number N of levels of the magnetic memory cells.

DETAILED DESCRIPTION OF THE INVENTION

Exemplary implementations of the present invention, as depicted respectively in FIGS. 1–6 and FIGS. 7–12, are directed to a magnetic memory array structure for a magnetic thin film semiconductor device, such as a thin film magnetoresistive memory device.

The following exemplary implementation is in reference to a thin film magnetoresistive memory device (MRAM). While the concepts of the present invention are conducive to MRAMs, the concepts taught herein may be applied to other semiconductor devices that would likewise benefit from the use of the structure disclosed herein. Therefore, the depiction of the present invention in reference to the manufacture of a MRAM (the preferred embodiment), is not meant to so limit the extent to which one skilled in the art might apply the concepts taught hereinafter.

Figure 1:
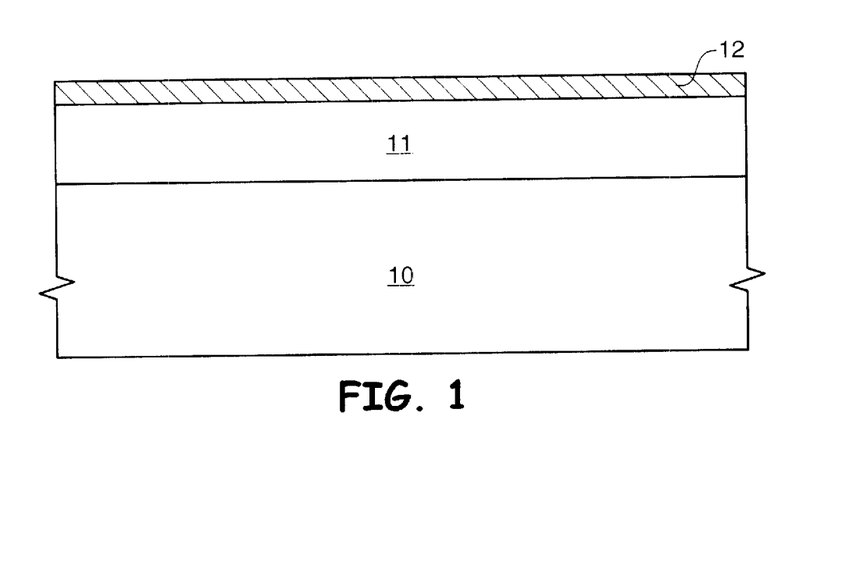
FIG. 1 is a cross-sectional view depicting a semiconductor substrate covered with tetraethylorthosilicate (TEOS) dielectric film and a first copper strip, which forms the first conductor of a first level magnetic memory cell.

As described above, a magnetic thin film semiconductor device may be implemented in various different technologies. One such application is in MRAM devices, an exemplary implementation of which is depicted in FIGS. 1–6. Referring now to FIG. 1, a semiconductive substrate 10, such as a silicon wafer, is prepared for the processing steps of the present invention. Insulating material 11, such as tetraethylorthosilicate (TEOS), is formed over substrate 10. Next, a conductive strip 12, such as copper, is formed over insulating material 11. Conductive strip 12 will function as a first conductor (or first bitline) to a first level of magnetic memory cells of the MRAM device.

Figure 2:
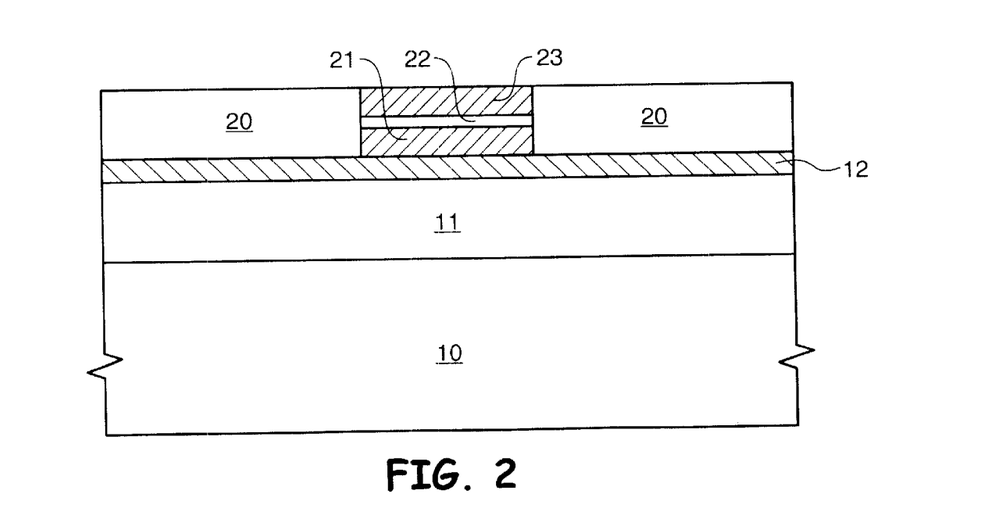
FIG. 2 is a subsequent cross-sectional view taken from FIG. 1 after patterning and etching of a sense layer and a pinned layer to a first level magnetic memory cell.

Referring now to FIG. 2, a dielectric material 20 is patterned and etched to allow the formation of a pinned layer 21, typically comprising a seed layer, such as NiFe, an antiferromagnetic layer, such as IrMn, and a ferromagnetic layer, such as NiFe, and the formation of a tunnel dielectric layer 22, such as $Al_2O_3$, and an overlying sense layer 23, typically NiFeCo, which combine to form the makeup of the magnetic memory core of the magnetic memory cell. The pinned layer is deposited so that it maintains a certain magnetic pole orientation. For example, a conductive material is deposited and then subjected to a large magnetic field in order to create a desired pole orientation. The combination of layers 21, 22 and 23 may comprise several materials that will respond as required for utilization in a magnetic memory core. The present invention does not limit what type of materials nor the combinations of materials used to construct the magnetic core of the memory cell, as the structural design of the present invention is adaptable to any suitable materials used. However, in the exemplary implementations of the present invention all materials are created in an elemental composition that classifies them as either antiferromagnetic or ferromagnetic materials.

Figure 3:
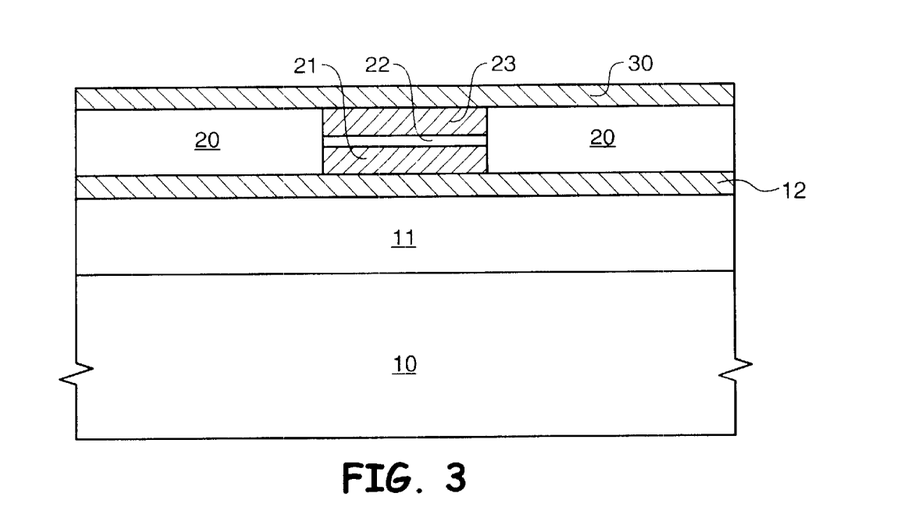
FIG. 3 is a subsequent cross-sectional view taken from FIG. 2 following the formation of a second copper strip running substantially parallel to the first copper strip, which forms the second conductor of a first level magnetic memory cell and which also forms a first conductor of a second level magnetic memory cell.

Referring now to FIG. 3, a second conductive strip 30, such as copper, which runs substantially parallel to the first conductor, is formed to create a second conductor (or wordline) for the first level of magnetic memory cells. Because of the unique structural arrangement of the present invention, this second conductor for the first level of magnetic memory cells can also serve as the first conductor of a second level of magnetic memory cells.

Figure 4:
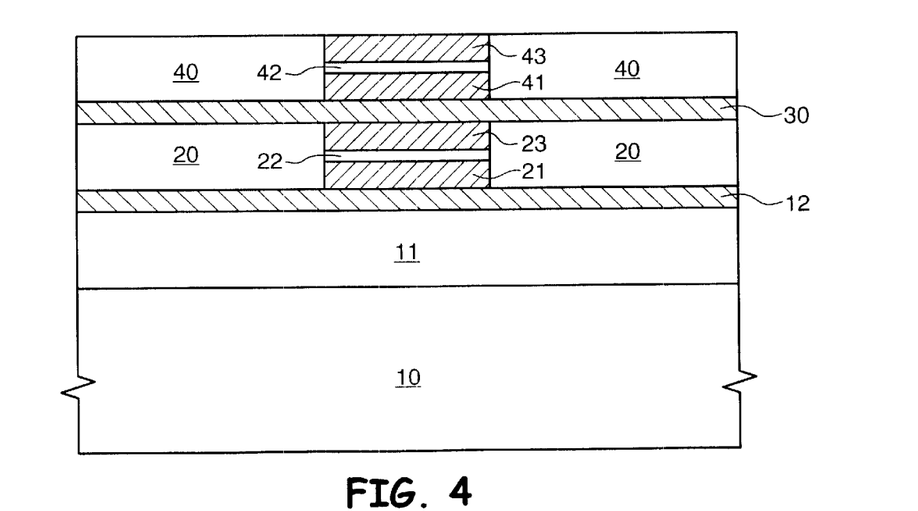
FIG. 4 is a subsequent cross-sectional view taken from FIG. 3 after patterning and etching of a sense layer and a pinned layer to a second level magnetic memory cell.

Referring now to FIG. 4, the steps of FIG. 2 are repeated as a dielectric material 40 is patterned and etched to allow the formation of a pinned layer 41, comprising a seed layer, such as NiFe, an antiferromagnetic layer, such as IrMn, and a ferromagnetic layer, such as NiFe, and the formation of a tunnel dielectric layer 42, such as $Al_2O_3$, and an overlying sense layer 43, typically NiFeCo, which combine to form the makeup of the magnetic memory core of the magnetic memory cell. As discussed in the text with FIG. 2, the pinned layer is deposited so that it maintains a certain magnetic pole orientation and the combination of layers 41, 42 and 43 may comprise several materials that will respond as required for utilization in a magnetic memory core.

Figure 5:
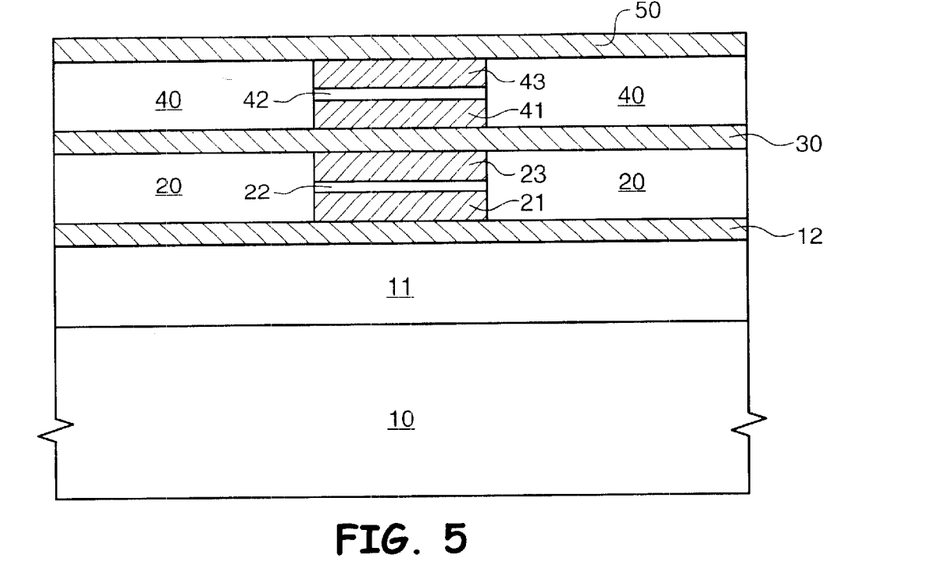
FIG. 5 is a subsequent cross-sectional view taken from FIG. 4 following the formation of a third copper strip running substantially parallel to the first and second copper strips, which forms the second conductor of a second level magnetic memory cell and which may also be used as a first conductor of an additional level magnetic memory cell.

Referring now to FIG. 5, a third conductive strip 50, such as copper, which runs substantially parallel to the second conductor, is formed to create a second conductor (or second bitline) for the second level of magnetic memory cells. Because of the unique structural arrangement of the present invention, this second conductor for the second level of magnetic memory cells can also serve as the first conductor of a third level of magnetic memory cells. The MRAM is then completed in accordance with fabrication steps used by those skilled in the art.

Figure 6:
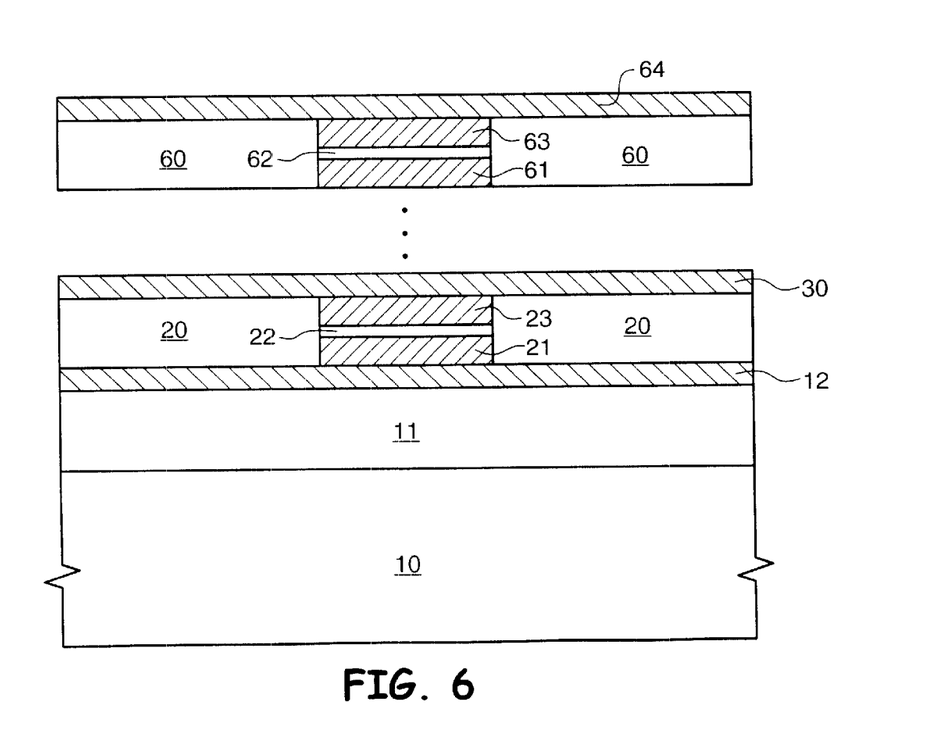
FIG. 6 is a subsequent cross-sectional view taken from FIG. 5 depicting a repeating pattern for forming multiple levels of magnetic memory cells, which illustrates that the number of conductive lines required for a desired number of levels of magnetic memory cells is N+1.

A final MRAM array structure, depicted in FIG. 6, further illustrates the concept of the present invention. Referring now to FIG. 6, multiple levels of magnetic memory cells are shown. The formation of multiple levels of magnetic memory cells is basically the repeat of the fabrication process depicted in FIG. 2 through FIG. 5, with each level of magnetic memory cells building one on top another. FIG. 6 demonstrates a concept of the present invention in that each cell comprises a first conductive strip and a second conductive strip to function as a first and second conductor to any given level of magnetic memory cells of the CMAM device. Sandwiched between the first and second conductors is the magnetic core, which is used in conjunction with the first and second conductors to store the state of the memory cell.

As shown in FIG. 6 a first level of magnetic memory comprises first conductor 12 and second conductor 30, with magnetic core materials 21 and 23 and tunnel dielectric layer 22 sandwiched therebetween. The presence of dielectric 20 keeps conductors 12 and 30 physically separated from one another. The second or higher level N of magnetic memory cells includes a first conductor comprising conductor 30 of the next lower level magnetic memory cells and a second conductor 64, with magnetic core material 61 and 63 and tunnel dielectric layer 62 sandwiched therebetween.

Figure 7A:
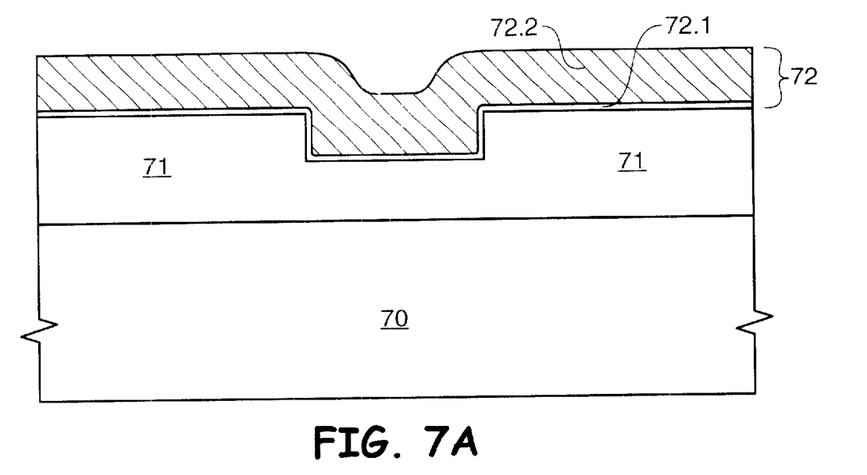
FIGS. 7a–7c are cross-sectional views depicting a semiconductor substrate fabricated with barrier layer variations using a tetraethylorthosilicate (TEOS) dielectric film and a first copper strip, which forms the first conductor of a first level magnetic memory cell.

A second exemplary implementation of the present invention for an MRAM device is depicted in FIGS. 7a–12. Referring now to FIG. 7a, a semiconductive substrate 70, such as a silicon wafer, is prepared for the processing steps of the present invention. Insulating material 71, such as tetraethylorthosilicate (TEOS), is formed over substrate 70. Next, a first thin barrier layer 72.1, such as tantalum (Ta) and a first conductive strip 72.2, such as copper, is formed over insulating material 71.

Figure 7B:
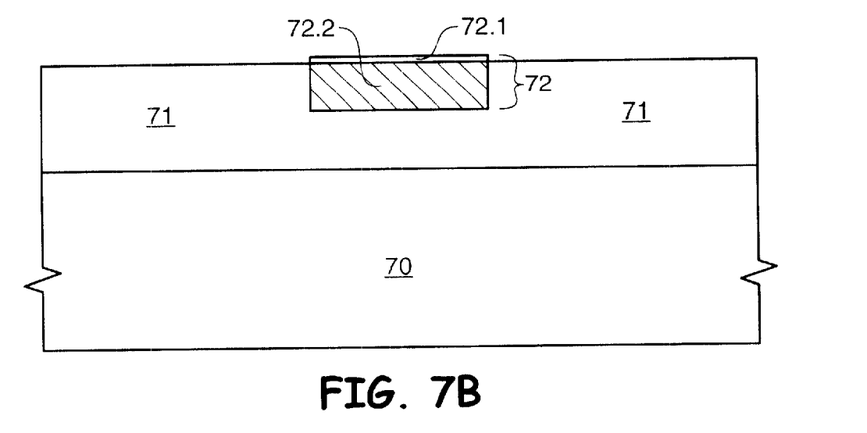
Figure 7C:
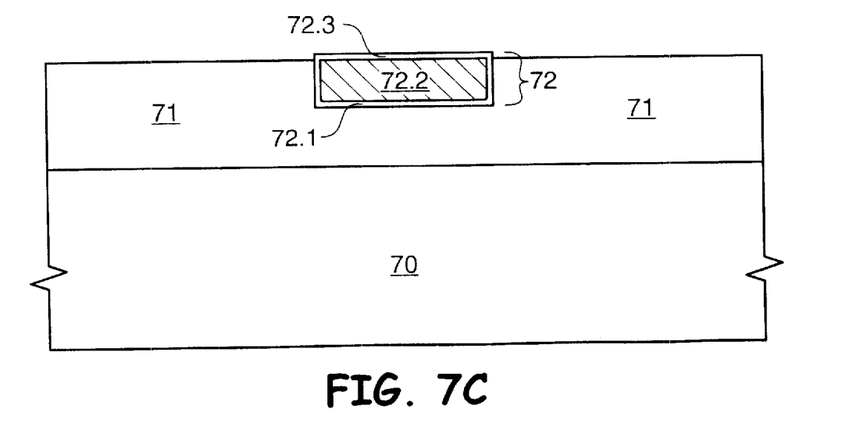

Alternative variations of a barrier layer are depicted in FIGS. 7b and 7c. As shown in FIG. 7b, the barrier layer 72.1 is formed and patterned directly on the first conductive strip 72.2 and thus will ultimately separate the first conductive strip and the subsequent second conductive strip.

As shown in FIG. 7c, the barrier layer is made up of two portions. A first barrier layer 72.1 is formed, followed by the formation of the first conductive strip 72.2 as described in FIG. 7a. After the first barrier layer 72.1 and first conductive strip 72.2 are planarized a second barrier layer 72.3 is formed and patterned directly on first conductive strip 72.2 to make a barrier layer that completely surrounds first conductive strip 72.2. These alternatives would carry though the rest of the fabrication process.

Figure 8:
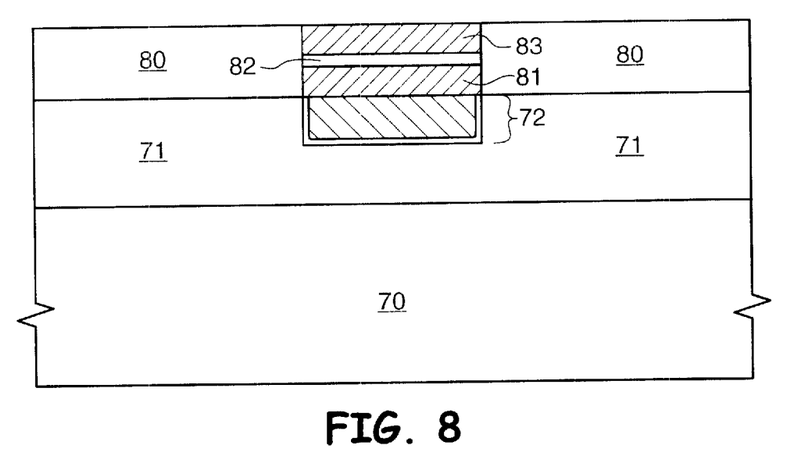
FIG. 8 is a subsequent cross-sectional view taken from FIG. 7 after patterning and etching of a sense layer and a pinned layer to a first level magnetic memory cell.

Referring now to FIG. 8, first thin conductive layer 72.1 and conductive strip 72.2 are planarized and will function as a first conductor 72 (or first bitline) to a first level of magnetic memory cells of the MRAM device. Next, a dielectric material 80 is patterned and etched to allow the formation of a pinned layer 81, typically comprising a seed layer, such as NiFe, an antiferomagnetic layer, such as IrMn, and a ferromagnetic layer, such as NiFe, and the formation of a tunnel dielectric layer 82, such as $Al_2O_3$, and an overlying sense layer 83, typically NiFeCo, which combine to form the makeup of the magnetic memory core to the magnetic memory cell. Pinned layer 81 is either deposited so that it maintains a certain magnetic pole orientation or is annealed later in a magnetic field to set the desired orientation.

For example, a magnetic material is deposited and then subjected to a large magnetic field in order to create the desired pole orientation. The combination of layers 81, 82 and 83 may comprise several materials that will respond as required for utilization in a magnetic memory core. The present invention does not limit what type of materials nor the combinations of materials used to construct the magnetic core of the memory cell, as the structural design of the present invention is adaptable to any suitable materials used.

Figure 9:
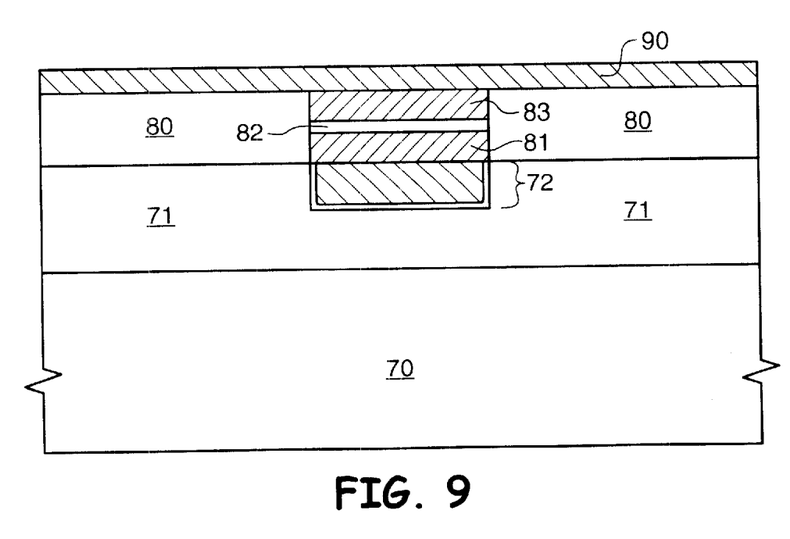
FIG. 9 is a subsequent cross-sectional view taken from FIG. 8 following the formation of a second copper strip running substantially perpendicular to the first copper strip, which forms the second conductor of a first level magnetic memory cell and which also forms a first conductor of a second level magnetic memory cell.

Referring now to FIG. 9, a second conductive strip 90, such as copper, which runs substantially perpendicular to the first conductor, is formed to create a second conductor (or wordline) for the first level of magnetic memory cells. Due to the unique structural arrangement of the present invention, this second conductor for the first level of magnetic memory cells can also serve as the first conductor of a second level of magnetic memory cells.

Figure 10:
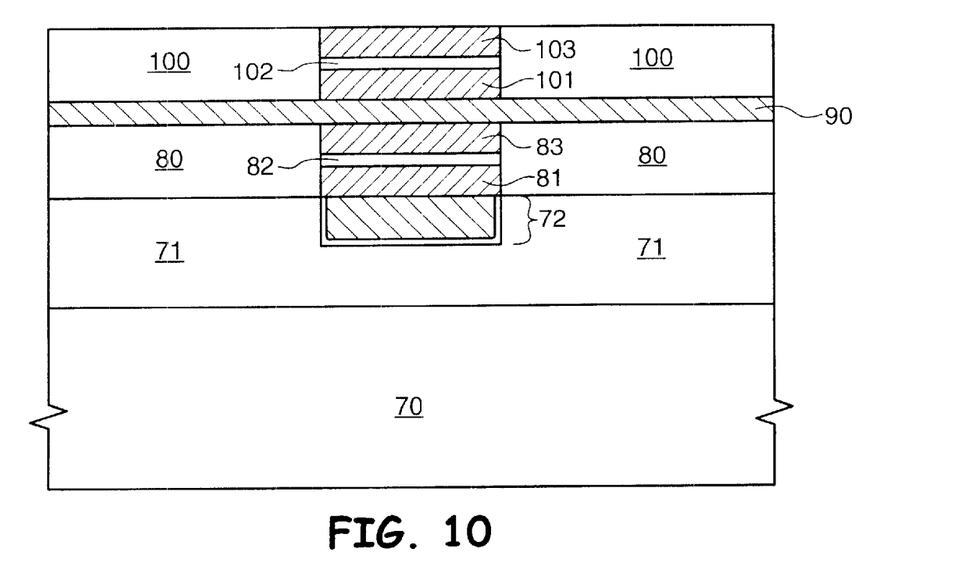
FIG. 10 is a subsequent cross-sectional view taken from FIG. 9 after patterning and etching of a sense layer and a pinned layer to a second level magnetic memory cell.

Referring now to FIG. 10, the steps of FIG. 8 are repeated as a dielectric material 100 is patterned and etched to allow the formation of pinned layer 101, comprising a seed layer, such as NiFe, an antiferomagnetic layer, such as IrMn, and a ferromagnetic layer, such as NiFe, and the formation of a tunnel dielectric layer 102, such as $Al_2O_3$, and an overlying sense layer 103, typically NiFeCo, which combine to form the makeup of the magnetic memory core of the magnetic memory cell. As discussed in the text with FIG. 8, the pinned layer is deposited so that it maintains a certain magnetic pole orientation and the combination of layers 101, 102 and 103 may comprise several materials that will respond as required for utilization in a magnetic memory core.

Figure 11:
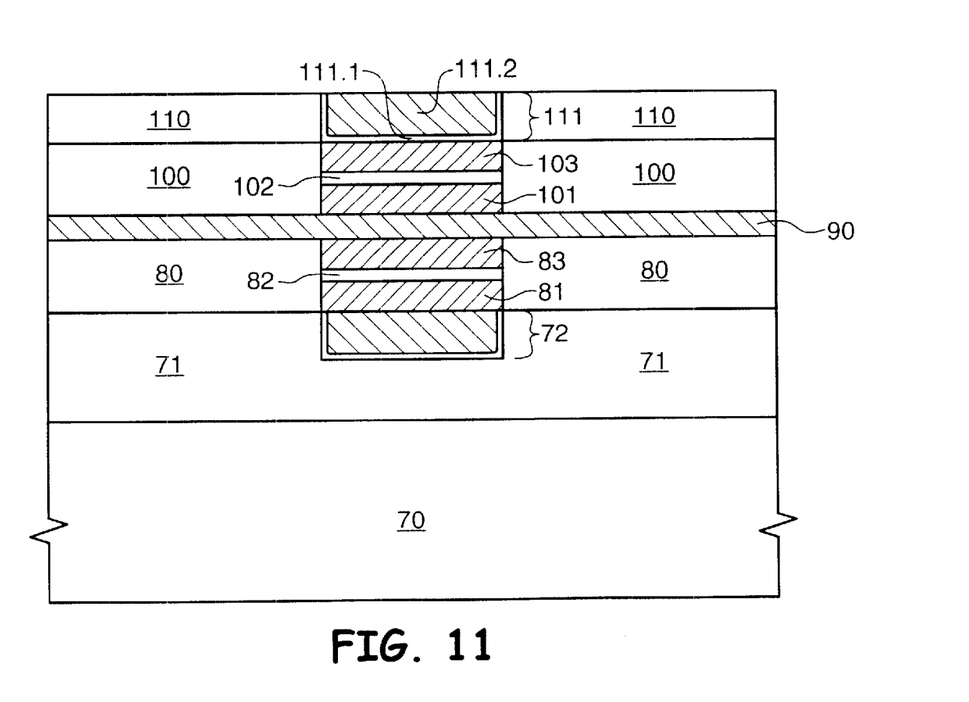
FIG. 11 is a subsequent cross-sectional view taken from FIG. 10 following the formation of a third copper strip running substantially perpendicular to the second copper strip and substantially parallel to the first copper strip, which forms the second conductor of a second level magnetic memory cell and which may also be used as a first conductor of an additional level magnetic memory cell.

Referring now to FIG. 11, dielectric layer 110 is formed and patterned in preparation for the subsequent formation of a second conductor. Next, a second thin conductive layer 111.1 and a third conductive strip 111.2, such as copper, which runs substantially perpendicular to the second conductor, are formed and planarized to create a second conductor (or second bitline) for the second level of magnetic memory cells. Because of the unique structural arrangement of the present invention, this second conductor for the second level of magnetic memory cells can also serve as the first conductor of a third level of magnetic memory cells. If so desired, the first and third conductors can be fabricated to run at an angle of 1–89° to the second conductor so that the first and second bitlines intersect the wordline at an angle ranging from 1 to 89°. The MRAM is then completed in accordance with fabrication steps used by those skilled in the art.

Figure 12:
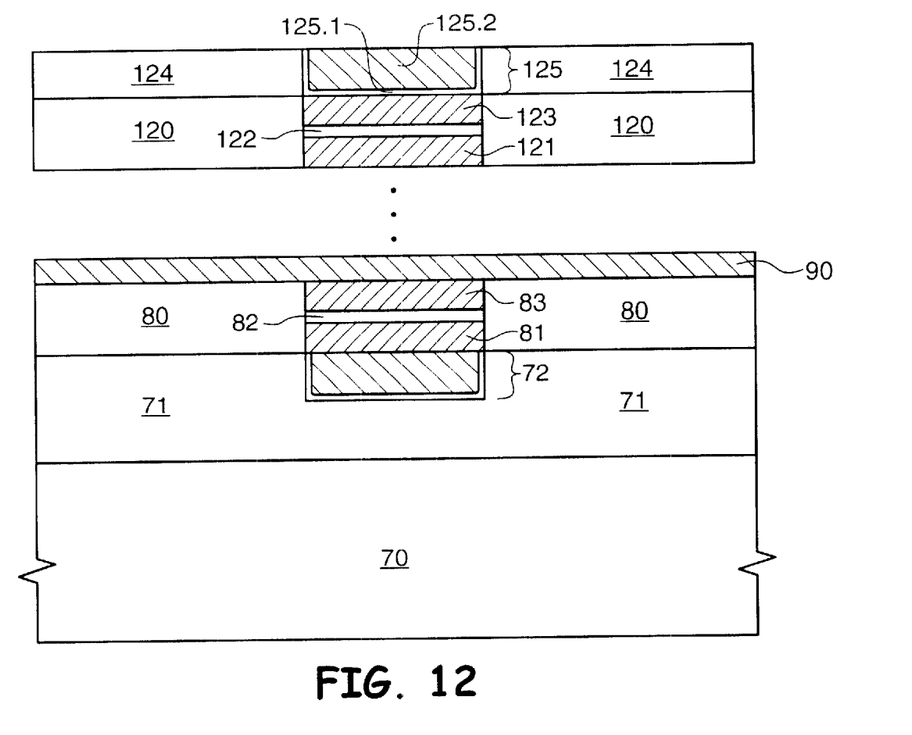
FIG. 12 is a subsequent cross-sectional view taken from FIG. 11 depicting a repeating pattern for forming multiple levels of magnetic memory cells, which illustrates that the number of conductive lines required for a desired number of levels of magnetic memory cells is N+1.

A final MRAM array structure, depicted in FIG. 12, further illustrates the concept of the present invention. Referring now to FIG. 12, multiple levels of magnetic memory cells are shown. The formation of multiple levels of magnetic memory cells is basically the repeat of the fabrication process depicted in FIG. 8 through FIG. 11, with each level of magnetic memory cells building one on top another. FIG. 12 demonstrates a concept of the present invention in that each cell comprises a first conductive strip and a second conductive strip to function as a first and second conductor to any given level of magnetic memory cells of the MRAM device. Sandwiched between the first and second conductors of each cell is the magnetic core, which is used in conjunction with the first and second conductors to store the state of the memory cell.

As shown in FIG. 12 a first level of magnetic memory comprises first conductor 72 and second conductor 90, with magnetic core materials 81 and 83 and tunnel dielectric layer 82 sandwiched there between. In a second or higher level N of magnetic memory cells, the first conductor comprises a conductor 90 of the next lower level magnetic memory cells and a second conductor 125 with magnetic core material 121 and 123 and tunnel dielectric layer 122 sandwiched therebetween.

FIGS. 6 and 12 each demonstrate that each adjacent level of magnetic memory cells will utilize a common conductor. Such a pattern allows for the fabrication of a magnetic memory having N levels of magnetic memory cells only requiring N+1 conductors. It is conceivable that only fabrication limitations and desired device operational characteristics would limited the number of levels of magnetic memory cells that those skilled in the art could build. Even with these possible constraints, the advantage of employing the structural design of the present invention would provide motivation to use the design as the number of conductors needed is only N+1 conductors versus conventional designs which use 2N conductors per N levels of magnetic memory cells.

It is to be understood that, although the present invention has been described with reference to a preferred embodiment, various modifications, known to those skilled in the art, may be made to the process disclosed herein without departing from the invention as recited in the several claims appended hereto.

What is claimed is:

1. A magnetic memory having a number N of levels of magnetic memory cells, said magnetic memory comprising:
    a plurality of levels of said magnetic memory cells, each level including at least one magnetic memory core structure having first and second surfaces, said first and second surfaces each connecting to an individual access conductor, wherein N+1 access conductors are employed per said number N of levels of said magnetic memory cells.

2. The magnetic memory of claim 1 wherein said conductors run substantially parallel to one another.

3. The magnetic memory of claim 1 wherein said conductors run substantially perpendicular to one another.

4. The magnetic memory of claim 1 wherein said conductors intersect one another at an angle ranging from 1° to 89°.

5. A magnetic random access memory (MRAM) having a number N of levels of magnetic memory cells, said magnetic memory comprising:
- a plurality of levels of said magnetic memory cells, each level including at least one magnetic memory bit structure having first and second surfaces;
- a bitline conductor connecting to said first surface of said magnetic memory bit structure;
- a wordline conductor connecting to said second surface of said magnetic memory bit structure;
- wherein, N+1 conductors are employed per said number N of levels of said magnetic memory cells.

6. The magnetic memory of claim 5 wherein said bitline conductor and said wordline conductor run substantially parallel to one another.

7. The magnetic memory of claim 5 wherein said bitline conductor and said wordline conductor run substantially perpendicular to one another.

8. The magnetic memory of claim 5 wherein said bitline conductor and said wordline conductor intersect one another at an angle ranging from 1° to 89°.

9. The magnetic memory of claim 5 wherein said magnetic memory bit structure comprises an NiFe seed layer, an IrMn antiferomagnetic layer, and an NiFe magnetic layer, a $Al_2O_3$ tunnel dielectric layer, and an NiFeCo overlying sense layer.

10. The magnetic memory of claim 5 wherein said bitline conductor and said wordline conductor comprise copper.

11. The magnetic memory of claim 10 wherein said bitline conductor comprises copper that is lined on at least one surface with tantalum.

12. A semiconductor device comprising a magnetic memory having a number N of levels of magnetic memory cells, said magnetic memory comprising:
- a plurality of levels of said magnetic memory cells, each level including at least one magnetic memory core structure having first and second surfaces, said first and second surfaces each connecting to an individual access conductor, wherein N+1 access conductors are employed per said number N of levels of said magnetic memory cells.

13. The semiconductor device of claim 12 wherein said conductors run substantially parallel to one another.

14. The semiconductor device of claim 12 wherein said conductors run substantially perpendicular to one another.

15. The semiconductor device of claim 12 wherein said conductors intersect one another at an angle ranging from 1° to 89°.

16. A semiconductor device comprising a magnetic random access memory (MRAM) having a number N of levels of magnetic memory cells, said magnetic memory comprising:
- a plurality of levels of said magnetic memory cells, each level including at least one magnetic memory bit structure having first and second surfaces;
- a bitline conductor connecting to said first surface of said magnetic memory bit structure;
- a wordline conductor connecting to said second surface of said magnetic memory bit structure;
- wherein, N+1 conductors are employed per said number N of levels of said magnetic memory cells.

17. The semiconductor device of claim 16 wherein said bitline conductor and said wordline conductor run substantially parallel to one another.

18. The semiconductor device of claim 16 wherein said bitline conductor and said wordline conductor run substantially perpendicular to one another.

19. The semiconductor device of claim 16 wherein said bitline conductor and said wordline conductor intersect one another at an angle ranging, from 1° to 89°.

20. The semiconductor device of claim 16 wherein said magnetic memory bit structure comprises an NiFe seed layer, an IrMn antiferomagnetic layer, and an NiFe magnetic layer, a $Al_2O_3$ tunnel dielectric layer, and an NiFeCo overlying sense layer.

21. The semiconductor device of claim 16 wherein said bitline conductor and said wordline conductor comprise copper.

22. The semiconductor device of claim 21 wherein said bitline conductor comprises copper that is lined on at least one surface with tantalum.

23. A method for forming a magnetic memory having a number N of levels of magnetic memory cells, said method comprising:
- forming a plurality of levels of said magnetic memory cells, each level including at least one magnetic memory core structure having first and second surfaces;
- forming a first access conductor connecting to said first surface;
- forming a second access conductor connecting to said second surface,
- wherein, N+1 access conductors are formed per said number N of levels of said magnetic memory cells.

24. The method of claim 23 wherein said conductors are formed to run substantially parallel to one another.

25. The method of claim 23 wherein said conductors are formed to run substantially perpendicular to one another.

26. The method of claim 23 wherein said conductors are formed to intersect one another at an angle ranging from 1° to 89°.

27. A method for forming a magnetic random access memory (MRAM) having a number N of levels of magnetic memory cells, said method comprising:
- forming a first bitline conductor;
- forming a first seed layer on said first bitline conductor, said first seed layer comprising a magnetic material;
- forming a first tunnel dielectric layer on said first seed layer;
- forming a first overlying sense layer on said first tunnel dielectric layer;
- patterning said first seed layer, said first tunnel dielectric layer and said first sense layer to form a first magnetic memory bit structure having first and second surfaces, said first surface connecting to said first bitline conductor;
- forming a wordline conductor connecting to said second surface of said first magnetic memory bit structure, said wordline conductor also acting as a second bitline conductor;
- forming a second seed layer on said second bitline conductor, said second seed layer comprising the magnetic material;
- forming a second tunnel dielectric layer on said second seed layer;
- forming a second overlying sense layer on said second tunnel dielectric layer;
- patterning said second seed layer, said second tunnel dielectric layer and said second sense layer to form a second magnetic memory bit structure having first and second surfaces, said first surface connecting to said second bitline conductor;
- repeating the above steps to form said number N of levels of said magnetic memory cells using N+1 conductors.

28. The method of claim 27 further comprising forming a barrier layer on the surface of said first and second bitline conductors and said wordline conductor.

29. The method of claim 27 further comprising forming a barrier layer on each surface of said wordline conductor not in contact with said first and second bitline conductors.

30. The method of claim 27 further comprising forming a barrier layer on only the surface of said wordline conductor in contact with said first and second bitline conductors.

31. The method of claim 27 further comprising forming a barrier layer on each surface of said wordline conductor in contact with said first and second bitline conductors.

32. The method of claim 27 wherein said first seed layer and said second seed layer each comprise an antiferomagnetic material and an ferromagnetic material.

33. The method of claim 27 wherein said bitline conductor and said wordline conductor run substantially parallel to one another.

34. The method of claim 27 wherein said bitline conductor and said wordline conductor run substantially perpendicular to one another.

35. The method of claim 27 wherein said bitline conductor and said wordline conductor intersect one another at an angle ranging from 1° to 89°.

36. The method of claim 27 wherein said first and second magnetic memory bit structures comprise an NiFe seed layer, an IrMn antiferomagnetic layer, and an NiFe ferromagnetic layer, a $Al_2O_3$ tunnel dielectric layer, and an NiFeCo overlying sense layer.

37. The method of claim 27 wherein said bitline conductor and said wordline conductor comprises copper.

38. The method of claim 37 wherein said bitline conductor comprises copper that is lined on at least one surface with tantalum.

* * * * *

UNITED STATES PATENT AND TRADEMARK OFFICE
CERTIFICATE OF CORRECTION

PATENT NO.   : 6,473,328 B1
DATED        : October 29, 2002
INVENTOR(S)  : Garry Mercaldi It is certified that error appears in the above-identified patent and that said Letters Patent is hereby corrected as shown below:

<u>Column 4,</u>
Line 41, please delete the word "CMAM" and replace with the word -- MRAM --.

Signed and Sealed this

Seventh Day of September, 2004

JON W. DUDAS
*Director of the United States Patent and Trademark Office*